(12) United States Patent
Choi et al.

(10) Patent No.: US 12,382,802 B2
(45) Date of Patent: Aug. 5, 2025

(54) FIBER-WOVEN DISPLAY DEVICE AND MANUFACTURING METHOD THEREOF

(71) Applicant: Korea Advanced Institute of Science and Technology, Daejeon (KR)

(72) Inventors: Kyung Cheol Choi, Daejeon (KR); Yong Ha Hwang, Daejeon (KR); Chan Young Kim, Daejeon (KR); Seong Uk Kong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 406 days.

(21) Appl. No.: 18/182,981

(22) Filed: Mar. 13, 2023

(65) Prior Publication Data

US 2024/0049533 A1 Feb. 8, 2024

(30) Foreign Application Priority Data

Aug. 4, 2022 (KR) .......................... 10-2022-0097275

(51) Int. Cl.
*H10K 59/131* (2023.01)
*H10K 59/123* (2023.01)
*H10K 50/10* (2023.01)

(52) U.S. Cl.
CPC ......... *H10K 59/131* (2023.02); *H10K 59/123* (2023.02); *H10K 50/182* (2023.02)

(58) Field of Classification Search
CPC .......................... H10K 59/123; H10K 59/131
See application file for complete search history.

(56) References Cited

U.S. PATENT DOCUMENTS

| | | | |
|---|---|---|---|
| 2003/0211797 A1* | 11/2003 | Hill | H05K 1/038 442/205 |
| 2011/0036448 A1* | 2/2011 | Van Pieterson | H05K 1/038 139/420 R |
| 2017/0251555 A1 | 8/2017 | Sunshine et al. | |

FOREIGN PATENT DOCUMENTS

| | | |
|---|---|---|
| KR | 10-2017-0049599 A | 5/2017 |
| KR | 10-2021-0135677 A | 11/2021 |

OTHER PUBLICATIONS

Office Action for KR 10-2022-0097275 by Korean Intellectual Property Office dated Dec. 18, 2024.

* cited by examiner

*Primary Examiner* — Douglas M Menz
(74) *Attorney, Agent, or Firm* — BROADVIEW IP LAW, PC

(57) ABSTRACT

Disclosed is a fiber-type organic light-emitting display panel including multiple element fibers extending in a first direction; and multiple wire fibers extending in a second direction, the multiple wire fibers being woven with the multiple element fibers, wherein each element fiber includes a core fiber, a light-emitting element and a driving element mounted on the core fiber, a first contact pad disposed in an area adjacent to the light-emitting element so as to electrically connect a first electrode layer of the light-emitting element and a first wire fiber, a second contact pad disposed in an area adjacent to the driving element so as to electrically connect a first electrode of the driving element and a second wire fiber, and a third contact pad disposed in an area adjacent to the driving element so as to electrically connect a second electrode of the driving element and a third wire fiber.

12 Claims, 11 Drawing Sheets

FIBER-WOVEN DISPLAY DEVICE AND MANUFACTURING METHOD THEREOF

CROSS-REFERENCE TO RELATED APPLICATIONS

This application claims priority to Korean Patent Application No. 10-2022-0097275 filed on Aug. 4, 2022 in the Korean Intellectual Property Office, the entire contents of which are hereby incorporated by reference in their entirety.

BACKGROUND OF THE INVENTION

Field of Invention

The present disclosure relates to a fiber-woven display device and a method for manufacturing the same and, more specifically, to a fiber-woven display device having an organic light-emitting diode (OLED) implemented on a fiber and a method for manufacturing the same.

Description of Related Art

An organic light-emitting display device refers to a display device that autonomously emits light by using an OLED, and can be manufactured to be lightweight and flat because no separate light source is necessary unlike an LCD. In addition, organic light-emitting display devices have advantages in terms of not only power consumption (low-voltage driving), but also color implementation, response rate, field of view, and contrast ratio (CR), and thus have been researched as next-generation display devices. Such advantages have increased the range of application of organic light-emitting display devices to smartphones, tablet PCs, wearable devices, and other personal portable devices, in addition to monitors and TVs.

Recent combination of technologies regarding display devices and those regarding fibers have been followed by development of conductive fibers that can both deliver electric signals and have the flexibility of fibers. Such conductive fibers, if applied to organic light-emitting display devices, can also be applied to garments, curtains, tents, bags, and other kinds of products, thereby prompting research regarding organic light-emitting fiber display technologies for applying conductive fibers to organic light-emitting display devices.

However, conventional organic light-emitting fiber display technologies have been focused on implementing display elements (that is, light-emitting elements and driving element) on fibers, and there has been no technology regarding a fiber display structure such that, when fibers are interwoven, display elements implemented on the fibers can have stable electric connection without being destroyed. Therefore, there is a need for a new fiber display structure such that, during fiber weaving, electric contact between a conductive fiber on which display elements are implemented (that is, element fiber) and conductive fiber used as a wire (that is, wire fiber) is stably guaranteed, and weaving integration can be implemented without destroying the display elements.

BRIEF SUMMARY OF THE INVENTION

It is an aspect of the present disclosure to solve the above-mentioned problems and other problems. It is another aspect of the present disclosure to provide a fiber-type organic light-emitting display panel having improved reliability and structural stability and a method for manufacturing the same.

It is another aspect of the present disclosure to provide a fiber-type organic light-emitting display panel including an element fiber on which a light-emitting element and a driving element are mounted and a wire fiber on which a circuit wire is mounted, and a method for manufacturing the same.

It is another aspect of the present disclosure to provide a fiber-type organic light-emitting display panel having an electric contact structure in which a driving element mounted on an element fiber and a circuit wire mounted on a wire fiber are spatially separated, and a method for manufacturing the same.

It is another aspect of the present disclosure to provide a fiber-type organic light-emitting display panel having an electric contact structure in which a light-emitting element mounted on an element fiber and a circuit wire mounted on a wire fiber are spatially separated, and a method for manufacturing the same.

In accordance with an aspect of the present disclosure, a fiber-type organic light-emitting display panel includes: multiple element fibers extending in a first direction; and multiple wire fibers extending in a second direction, the multiple wire fibers being woven with the multiple element fibers, wherein each element fiber includes a core fiber, a light-emitting element and a driving element mounted on the core fiber, a first contact pad disposed in an area adjacent to the light-emitting element so as to electrically connect a first electrode layer of the light-emitting element and a first wire fiber, a second contact pad disposed in an area adjacent to the driving element so as to electrically connect a first electrode of the driving element and a second wire fiber, and a third contact pad disposed in an area adjacent to the driving element so as to electrically connect a second electrode of the driving element and a third wire fiber.

In an embodiment, the light-emitting element may be an organic light-emitting diode, and the driving element may be a thin-film transistor (TFT). In addition, the first electrode layer of the light-emitting element may be an anode electrode, the first electrode of the driving element may be a source electrode, and the second electrode of the driving element may be a gate electrode.

In an embodiment, the first contact pad may make contact with a side surface of an anode electrode positioned at an uppermost end of the organic light-emitting diode. In addition, the first contact pad may electrically connect the anode electrode of the organic light-emitting diode and the first wire fiber and may spatially separate the anode electrode and the first wire fiber.

In an embodiment, the second contact pad may make contact with a side surface of a source electrode constituting the thin-film transistor. In addition, the second contact pad may electrically connect the source electrode of the thin-film transistor and the second wire fiber and may spatially separate the source electrode and the second wire fiber.

In an embodiment, the third contact pad may make contact with a side surface of a gate electrode constituting the thin-film transistor. In addition, the third contact pad may electrically connect the gate electrode of the thin-film transistor and the third wire fiber and may spatially separate the gate electrode and the third wire fiber.

In an embodiment, the first to third contact pads may be formed by using thermal vacuum evaporation or sputtering. In addition, a process of laminating the first to third contact pads may proceed in a state in which a core fiber having the light-emitting element and the driving element mounted thereon is rotated by a predetermined angle.

In accordance with an aspect of the present disclosure, an element fiber for a display panel includes: a core fiber; a light-emitting element mounted on the core fiber; a driving element mounted on the core fiber; a first contact pad disposed in an area adjacent to the light-emitting element so as to electrically connect a first electrode layer of the light-emitting element and a first wire fiber; a second contact pad disposed in an area adjacent to the driving element so as to electrically connect a first electrode of the driving element and a second wire fiber; and a third contact pad disposed in an area adjacent to the driving element so as to electrically connect a second electrode of the driving element and a third wire fiber.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE INVENTION

Figure 1:
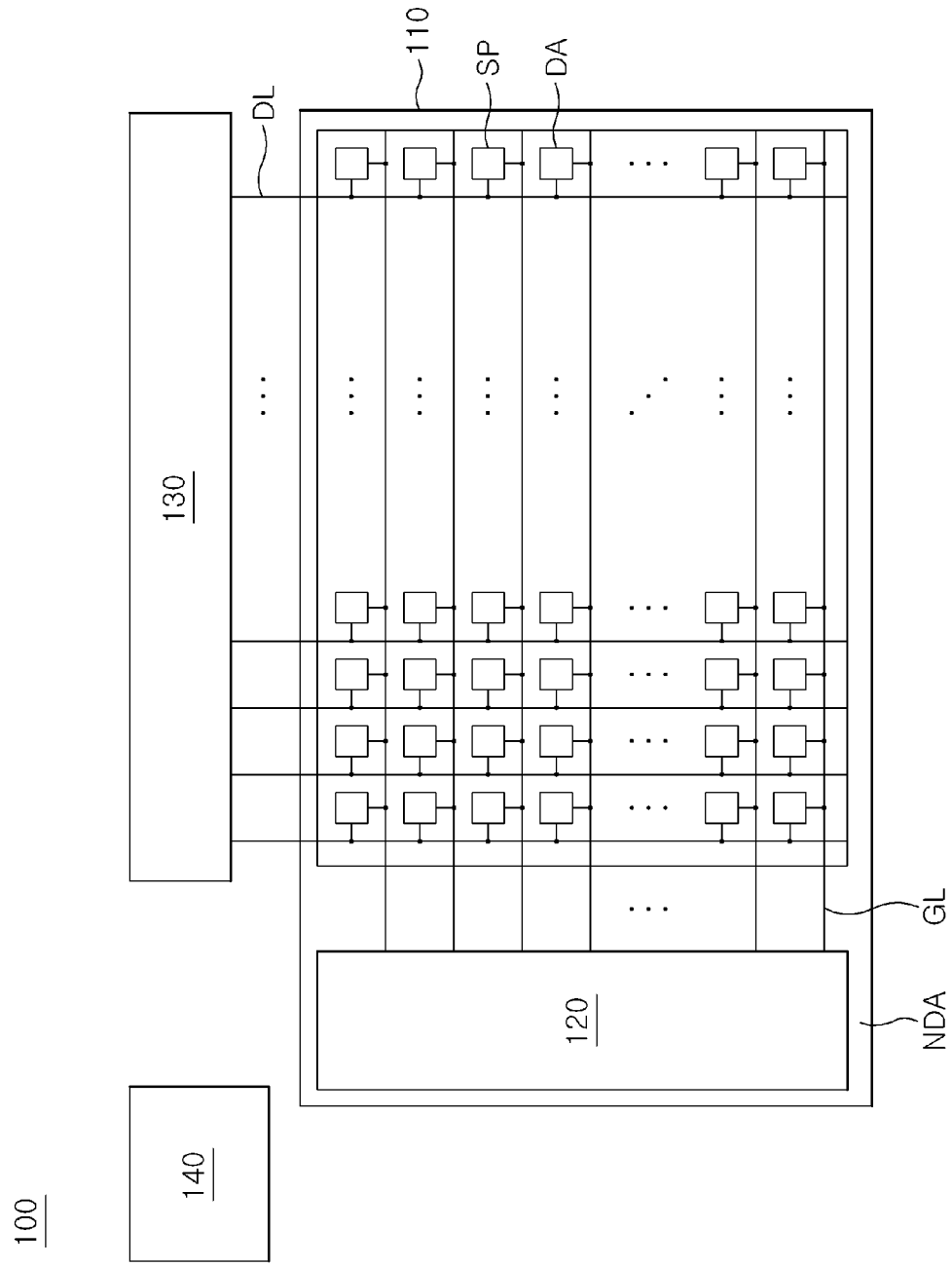
FIG. 1 is a block diagram illustrating the configuration of an organic light-emitting fiber-woven display device according to an embodiment of the present disclosure.

Hereinafter, embodiments disclosed in the present specification will be described in detail with reference to the accompanying drawings. Identical or similar components will be given identical reference numerals, and repeated descriptions thereof will be omitted. In the following description of embodiments of the present disclosure, when it is described that respective layers (films), areas, patterns, or structures are formed "on" or "under" substrates, respective layers (films), areas, pads, or patterns, the wording "being formed on or "under" includes both "being formed directly" and "being formed indirectly". In addition, respective layers will be described as being "on" or "under" with reference to the drawings. The thickness or size of respective layers are exaggerated, omitted, or schematically illustrated in the drawings for convenience and clarity of description. In addition, the size of respective components is not entirely to scale.

In addition, in the following description of embodiments disclosed in the present specification, detailed descriptions of related known arts will be omitted if deemed to unnecessarily obscure the gist of embodiments disclosed in the present specification. The accompanying drawings are only for facilitating understanding of embodiments disclosed in the present specification. The technical idea disclosed in the present specification is not limited by the accompanying drawings, and is to be understood as encompassing all changes, equivalents, or replacements falling within the idea and technical scope of the present disclosure.

The present disclosure proposes a fiber-type organic light-emitting display panel having improved reliability and structural stability and a method for manufacturing the same. In addition, the present disclosure proposes a fiber-type organic light-emitting display panel including an element fiber on which a light-emitting element and a driving element are mounted and a wire fiber on which a circuit wire is mounted, and a method for manufacturing the same. In addition, the present disclosure proposes a fiber-type organic light-emitting display panel having an electric contact structure in which a driving element mounted on an element fiber and a circuit wire mounted on a wire fiber are spatially separated, and a method for manufacturing the same. In addition, the present disclosure proposes a fiber-type organic light-emitting display panel having an electric contact structure in which a light-emitting element mounted on an element fiber and a circuit wire mounted on a wire fiber are spatially separated, and a method for manufacturing the same.

Hereinafter, various embodiments of the present disclosure will be described in detail with reference to the drawings.

FIG. 1 is a block diagram illustrating the configuration of an organic light-emitting fiber-woven display device according to an embodiment of the present disclosure.

Referring to FIG. 1, an organic light-emitting fiber-woven display device 100 according to an embodiment of the present disclosure may include a fiber-type organic light-emitting display panel 110, a gate driving circuit 120, a data driving circuit 130, and a timing controller 140.

The fiber-type organic light-emitting display panel 110 may include multiple sub-pixels SP formed in areas of intersection between multiple data lines DL and multiple gate lines GL. Each sub-pixel SP may include a light-emitting element and a driving element.

The fiber-type organic light-emitting display panel 110 may be encapsulated to protect at least one film or substrate, and sub-pixels SP formed on the film or substrate from external materials such as moisture or oxygen. The fiber-type organic light-emitting display panel 110 may include a display area DA in which sub-pixels SP are formed, and a non-display area NDA which is on the outer periphery of the display area DA, in which various signal lines, pads, or the like are formed, and which displays no images.

The display area DA, in which images are displayed, may thus have sub-pixels SP positioned therein. The non-display area NDA, in which no images are displayed, may have dummy sub-pixels SP positioned therein, or no sub-pixels SP positioned therein.

The fiber-type organic light-emitting display panel 110 may include multiple element fibers and multiple wire fibers, which are woven. The fiber-type organic light-emitting display panel 110 may be formed as a flexible display panel because the same includes fiber-type elements having flexibility, and may be configured such that images can be displayed even in bent areas resulting from bending of the inside of the display area DA. The fiber-type organic light-emitting display panel 110 may implemented in a topemission type, a bottom-emission type, or a dual-emission type, depending on the manner in which the sub-pixels SP are configured.

The gate driving circuit 120 may be connected to multiple gate lines GL so as to supply a gate signal to corresponding sub-pixels SPs. Specifically, the gate driving circuit 120 may receive a gate control signal, including clock signals and a start voltage, from a level shifter (not illustrated). The gate driving circuit 120 may generate gate signals according to the clock signals and the start voltage, and may provide the same to the gate lines GL.

The level shifter may level-shift clock signals and the voltage level of a start voltage, which are input from the timing controller 140, to a gate-on voltage and agate-off voltage, which can be used to switch transistors formed on the fiber-type organic light-emitting display panel 110. The level shifter may supply level-shifted clock signals to the gate driving circuit 120 through clock lines, and may supply a level-shifted start voltage to the gate driving circuit 120 through a start voltage line. The clock lines and the start voltage line transmit a clock signal and a start voltage, which correspond to gate control signals, respectively, and may thus be referred to as a gate control line as a whole.

The data driving circuit 130 may be connected to multiple data lines DL. The data driving circuit 130 may receive digital image data and a data control signal from the timing controller 140. The data driving circuit 130 may convert digital image data into an analog data voltage according to a data control signal, and may supply the analog data voltage to the data lines DL.

The timing controller 140 may receive digital image data and timing signals from an external system board. The timing signals may include a vertical synchronization signal, a horizontal synchronization signal, and a data enable signal.

The timing controller 140 may generate a gate control signal for controlling the timing of operation of the gate driving circuit 120 and a data control signal for controlling the timing of operation of the data driving circuit 130, on the basis of the timing signals.

The data driving circuit 130, the level shifter, and the timing controller 140 may be formed as a single driving IC. In addition, the single integrated driving IC may be disposed on the fiber-type organic light-emitting display panel 110. Meanwhile, embodiments of the present disclosure are not limited thereto, and the data driving circuit 130, the level shifter, and the timing controller 140 may be formed as separate driving ICs, respectively.

Figure 2A:
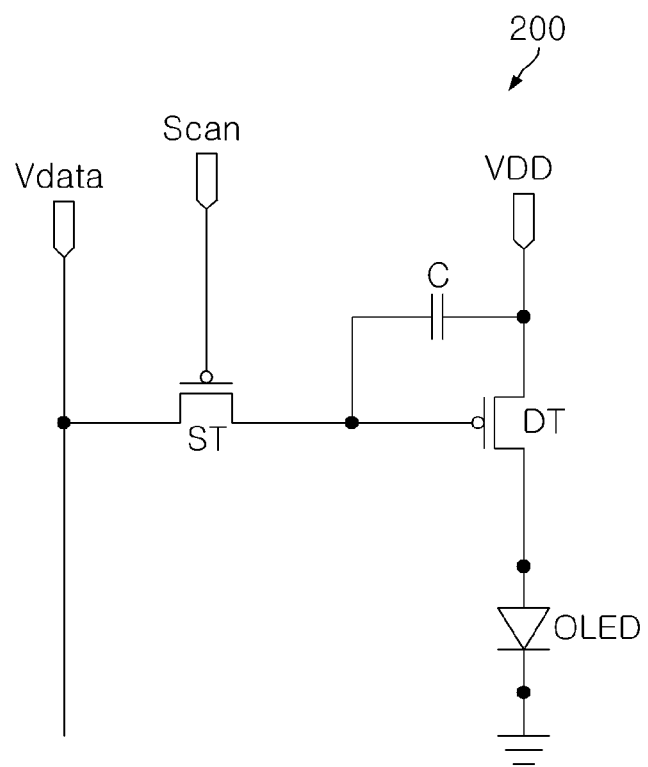
FIG. 2A and FIG. 2B illustrate an equivalent circuit of a sub-pixel constituting a fiber-type organic light-emitting display panel in FIG. 1.
Figure 2B:
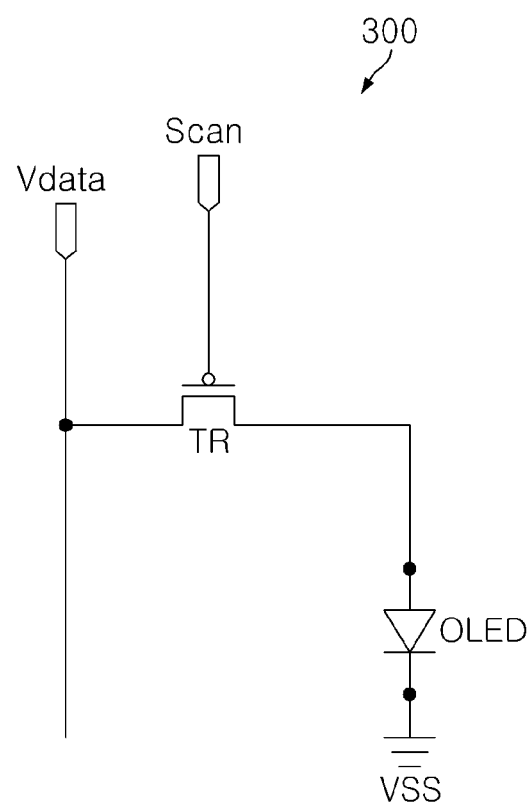

FIG. 2 illustrates an equivalent circuit of a sub-pixel constituting a fiber-type organic light-emitting display panel in FIG. 1. More specifically, FIG. 2A illustrates an equivalent circuit of a sub-pixel according to an embodiment of the present disclosure, and FIG. 2B illustrates an equivalent circuit of a sub-pixel according to another embodiment of the present disclosure.

As illustrated in FIG. 2A, an equivalent circuit 200 of a sub-pixel according to an embodiment of the present disclosure may include an organic light-emitting diode OLED, a scan transistor ST, a driving transistor DT, and a capacitor C. The organic light-emitting diode OLED corresponds to a light-emitting element of the sub-pixel, and the scan transistor ST, the driving transistor DT, and the capacitor C correspond to driving elements of the sub-pixel.

The scan transistor ST and the driving transistor DT may drive the organic light-emitting diode OLED on the basis of control signals received from the gate driving circuit 120 and the data driving circuit 130. The scan transistor ST and the driving transistor DT may be made of thin-film transistors (TFT), respectively.

The scan transistor ST may have a gate electrode connected to a gate line GL, a source electrode connected to a data line DL, and a drain electrode connected to a gate electrode of the driving transistor DT.

If the scan transistor ST is turned on by a scan signal Scan applied though the gate line GL, a data voltage Vdata provided through the data line DL may be applied to the gate electrode of the driving transistor DT.

The driving transistor DT may have a gate electrode connected to the drain electrode of the scan transistor ST, may have a source electrode connected to a high-potential voltage line configured to provide a driving voltage VDD, and may have a drain electrode connected to an anode electrode Anode of an organic light-emitting diode OLED. If the scan transistor ST is turned on such that a data voltage Vdata is applied to the gate electrode of the driving transistor DT, the driving transistor DT may be turned on such that a driving current is provided to the organic light-emitting diode OLED.

The capacitor C is connected between the source electrode of the driving transistor DT and the gate electrode of the driving transistor DT so as to store the voltage difference between the driving voltage VDD applied to the source electrode of the driving transistor DT and the data voltage Vdata applied to the gate electrode of the driving transistor DT such that a constant current can be supplied to the organic light-emitting diode OLED.

The organic light-emitting diode OLED may have an anode electrode connected to the drain electrode of the driving transistor DT, and may have a cathode electrode connected to the ground. The organic light-emitting diode OLED may emit light on the basis of a driving current received from the driving transistor DT.

The scan transistor ST, the driving transistor DT, the capacitor C, and the organic light-emitting diode OLED, which constitute the sub-pixel SP, may be mounted on an element fiber. The corresponding sub-pixel SP may operate in an active matrix type.

Meanwhile, as illustrated in FIG. 2B, an equivalent circuit 300 of a sub-pixel according to another embodiment of the present disclosure may include one organic light-emitting diode OLED and one transistor TR. The organic light-emitting diode OLED corresponds to a light-emitting element of the sub-pixel, and the transistor TR corresponds to a driving element of the sub-pixel.

The transistor TR may drive the organic light-emitting diode OLED on the basis of control signals received from the gate driving circuit 120 and the data driving circuit 130. The transistor TR may be a thin-film transistor TFT.

The transistor TR may have a gate electrode connected to the gate line GL, may have a source electrode connected to the data line DL, and may have a drain electrode connected to the anode electrode Anode of the organic light-emitting diode OLED.

If the transistor TR is turned on by a scan signal Scan applied through the gate line GL, a data voltage Vdata provided through the data line DL may be applied to the organic light-emitting diode OLED.

The organic light-emitting diode OLED may have an anode electrode connected to the drain electrode of the transistor TR, and may have a cathode electrode connected to the ground. The organic light-emitting diode OLED may emit light on the basis of a driving current received from the transistor TR.

The transistor TR and the organic light-emitting diode OLED, which constitute the sub-pixel SP, may be mounted on an element fiber. The corresponding sub-pixel SP may operate in a massive matrix type.

Meanwhile, it will be obvious to a person skilled in the art that, although the first equivalent circuit 200 and the second equivalent circuit 300 have been described herein as examples of an equivalent circuit of a sub-pixel SP constituting a fiber-type organic light-emitting display panel, the same is not necessarily limited thereto, and may be configured in other types than the first and second equivalent circuits 200 and 300. It will be assumed in the following description of the present embodiment, for convenience of description, that the second equivalent circuit 300 is used as an equivalent circuit of a sub-pixel constituting a fiber-type organic light-emitting display panel.

Figure 3:
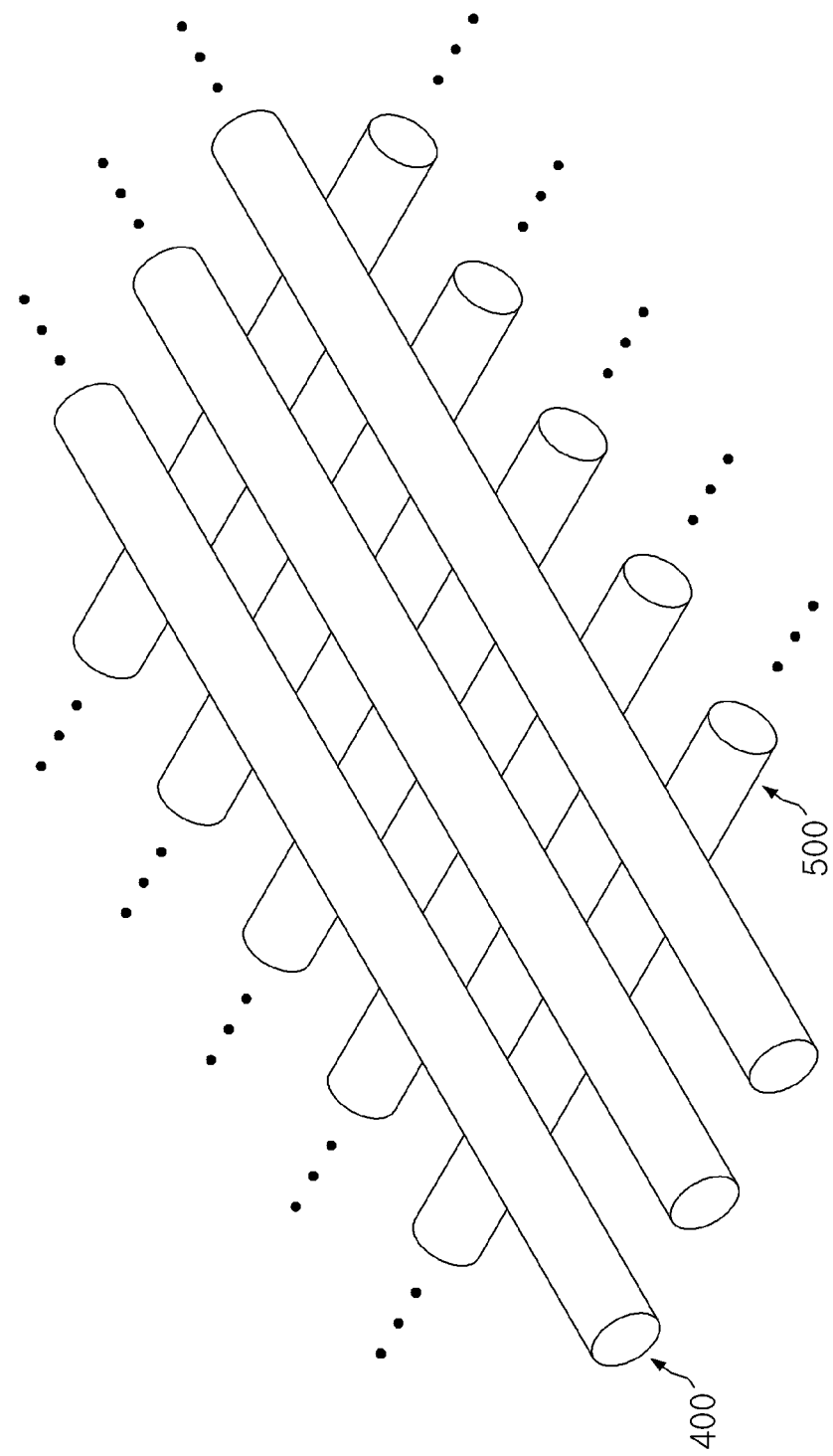
FIG. 3 illustrates a weaving structure of an element fiber and a wire fiber constituting the fiber-type organic light-emitting display panel in FIG. 1.
Figure 4:
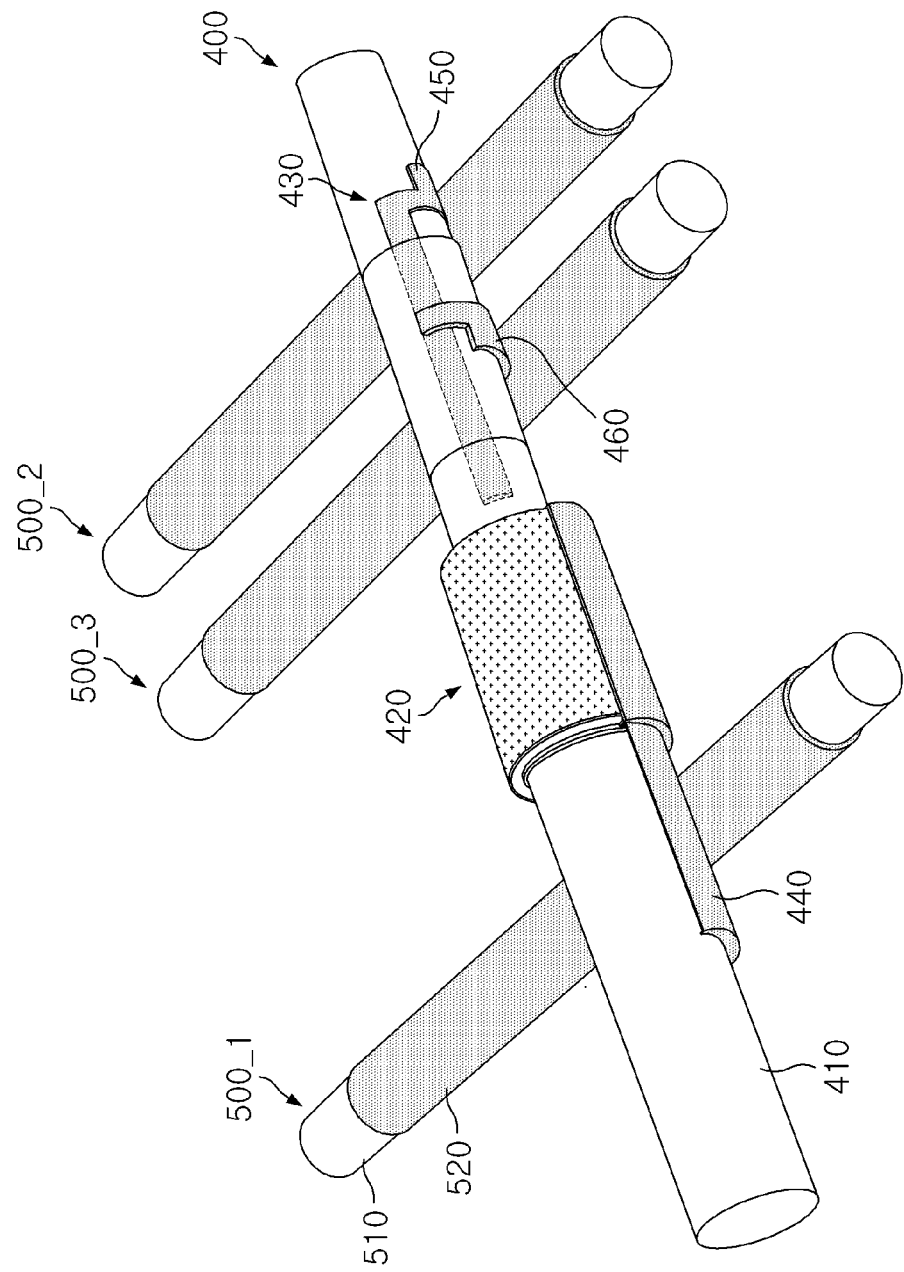
FIG. 4 is a magnified view of an area of the fiber-type organic light-emitting display panel in FIG. 3.

FIG. 3 illustrates a weaving structure of an element fiber and a wire fiber constituting the fiber-type organic light-emitting display panel in FIG. 1. FIG. 4 is a magnified view of an area of the fiber-type organic light-emitting display panel in FIG. 3.

Referring to FIG. 3 and FIG. 4, the fiber-type organic light-emitting display panel 110 according to an embodiment of the present disclosure may include multiple element fibers 400 and multiple wire fiber 500, which are woven.

The fiber-type organic light-emitting display panel 110 may have multiple element fibers 400 disposed at a predetermined interval so as to extend in the longitudinal direction, and may have multiple wire elements 500 disposed at a predetermined interval under the element fibers 400 perpendicularly to the element fibers 400.

The multiple element fibers 400 may be electrically connected to the multiple wire fibers 500 through a conductive contact area. The conductive contact area, as used herein, refers to an area in which the element fibers 400 and the wire fibers 500 contact each other. The conductive contact area may be positioned in an adjacent area (for example, opposite side) of a light-emitting element 420 and a driving element 430 mounted on each element fiber 400.

Since the wire fibers 500 contact lower portions of the element fibers 400, the fiber-type organic light-emitting display panel 110 may have a light-emitting area formed upwards. To the contrary, if the wire fibers 500 contact upper portions of the element fibers 400, the fiber-type organic light-emitting display panel 110 may have a light-emitting area formed downwards.

Meanwhile, it will be obvious to a person skilled in the art that, although it is assumed in the description of the present embodiment that the element fibers 400 are disposed in parallel, and the wire fibers 500 are disposed in parallel under the element fibers 400, the element fibers 400 and the wire fibers 500 may be woven or fabricated so as to intersect with each other on the basis of flexibility thereof.

Each element fiber 400 may include a core fiber 410, multiple light-emitting elements 420 mounted on the core fiber 410, multiple driving elements 430, multiple first contact pads 440, multiple second contact pads 450, and multiple third contact pads 460. The light-emitting elements 420 may be OLEDs, and the driving elements 430 may be TFTs.

The multiple light-emitting elements 420 may be disposed in a row along the longitudinal direction of the core fiber 410. The multiple light-emitting elements 420 may be fabricated by depositing an organic material layer and an inorganic material layer by using dip-coating or thermal vacuum evaporation.

The multiple driving elements 430 may be disposed in a row along the longitudinal direction of the core fiber 410. The multiple driving elements 430 may be fabricated by depositing an inorganic material layer by using dip-coating, thermal vacuum evaporation, or sputtering.

The multiple light-emitting elements 420 and the multiple driving elements 430 may be positioned alternately on the core fiber 410. That is, a light-emitting element 420, a driving element 430, another light-emitting element 420, another driving element 430, and so forth may be disposed on the core fiber 410.

The multiple first contact pads 440 may be disposed in areas adjacent to the light-emitting elements 420 so as to electrically connect the light-emitting elements 420 and the wire fibers 500.

The multiple second contact pads 450 may be disposed in areas adjacent to source layers of the driving elements 430 so as to electrically connect the source layers and the wire fibers 500.

The multiple third contact pads 460 may be disposed in areas adjacent to gate layers of the driving elements 430 so as to electrically connect the gate layers and the wire fibers 500.

Each wire fiber 500 may include a core fiber 510 and a circuit wire 520 mounted on the core fiber 510. The circuit wire 520 may be made of a conductive material. The circuit wire 520 may be configured to transfer an electric signal to an element fiber 400.

The wire fibers 500 may be formed by depositing nanoparticles, nanowires, conductive polymers, or metal thin films on the core fibers 510 by using dip-coating or thermal vacuum evaporation.

The wire fibers 500 may contact the first to third contact pad 440-460 positioned under the element fibers 400. For example, as illustrated in FIG. 4, the first wire fiber 500_1 may contact the first contact pad 440 electrically connected to the anode or cathode electrode of an organic light-emitting diode 420 and spatially separated from the anode or cathode electrode. The second wire fiber 500_2 may contact the second contact pad 450 electrically connected to the source layer of a thin-film transistor 430 and spatially separated from the source layer. The third wire fiber 500_3 may contact the third contact pad 460 electrically connected to the gate layer of the thin-film transistor 430 and spatially separated from the gate layer.

As such, the fiber-type organic light-emitting display panel 110 according to the present disclosure has multiple contact pads 440-460 disposed on an element fiber 400 in view of the position in which an organic light-emitting diode 420 and a thin-film transistor 430 are mounted, thereby having a connecting structure in which a wire fiber 500 has no direct contact with the organic light-emitting diode 420 and the thin-film transistor 430. Such a connecting structure makes it possible to effectively implement weaving integration of the fiber-type organic light-emitting display panel 110 without destroying the organic light-emitting diode 420 and the thin-film transistor 430, while guaranteeing stable electric contact between the element fiber 400 and the wire fiber 500.

Figure 5A:
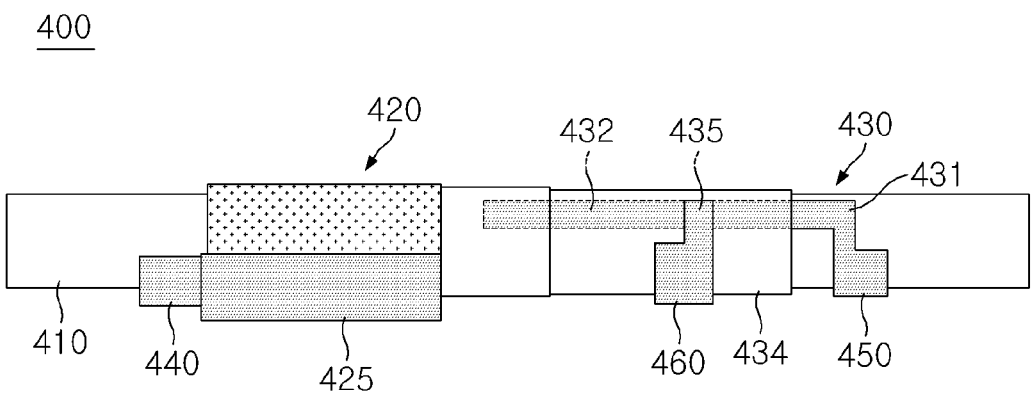
FIG. 5A to FIG. 5C illustrate the configuration of an element fiber according to an embodiment of the present disclosure.
Figure 5B:
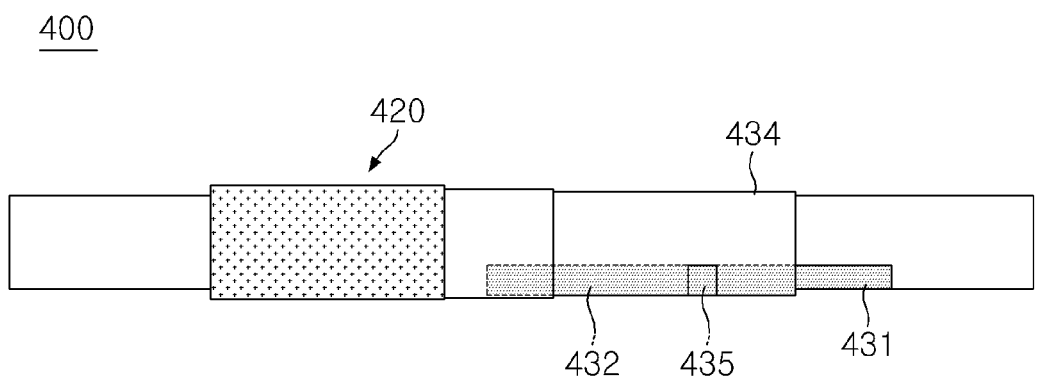
Figure 5C:
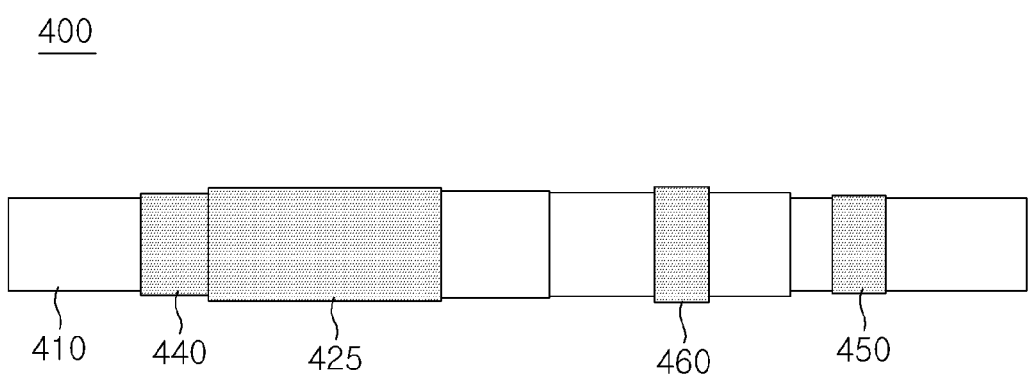
Figure 6A:
FIG. 6A to FIG. 6H illustrate a method for manufacturing an element fiber according to an embodiment of the present disclosure.
Figure 6B:
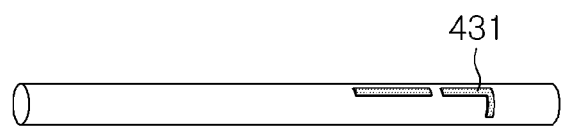
Figure 6C:
Figure 6D:
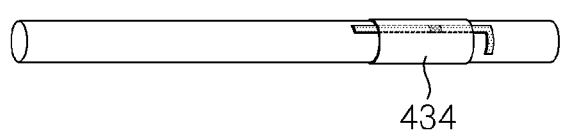
Figure 6E:
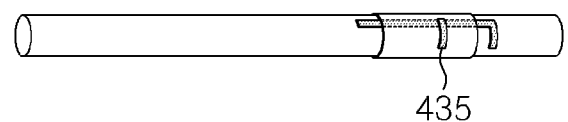
Figure 6F:
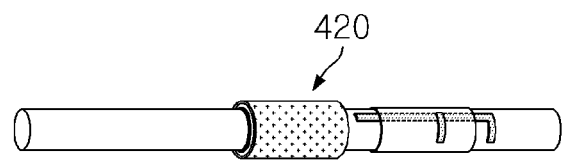
Figure 6G:
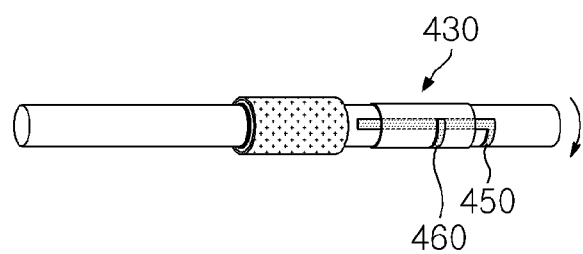
Figure 6H:
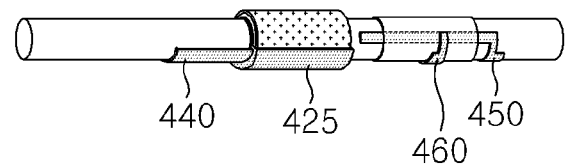

FIG. 5A to FIG. 5C illustrate the configuration of an element fiber according to an embodiment of the present disclosure. Specifically, FIG. 5A is a view of the element fiber seen in a first direction, FIG. 5B is a view of the element fiber seen in a second direction, and FIG. 5C is a view of the element fiber seen in a third direction.

Referring to FIG. 5A to FIG. 5C, the element fiber 400 according to an embodiment of the present disclosure may include a core fiber 410 extending in the longitudinal direction, multiple light-emitting elements 420 mounted on the core fiber 410, multiple driving elements 430, multiple first contact pads 440, multiple second contact pads 450, and multiple third contact pads 460.

The core fiber 410 may have flexibility or rigidity, and the flexible fiber may have ductility or elasticity. The core fiber 410 may be transparent, semi-transparent, opaque, or reflective, and may be made of glass, plastic, ceramic, or metal foil.

The core fiber 410 may include a flexible polymer, a metallic material, or glass. The flexible polymer may be polyolefin, for example, polyethylene, polypropylene, or polytetrafluoroethylene, polysiloxane, epoxy, polyacrylate, polyethylene terephthalate, and a derivative thereof. The metallic material may include aluminum, copper, or steel. The glass may be soda lime glass, glass containing Ba or Sr, lead glass, aluminum silicate glass, borosilicate, Ba borosilicate glass, or quartz.

The multiple light-emitting elements 420 may be disposed in a row along the longitudinal direction of the core fiber 410. The multiple light-emitting elements 420 may be disposed on the core fiber 410 such that a light-emitting element is spaced apart from an adjacent light-emitting element by a predetermined interval. The multiple light-emitting elements 420 may emit light in different wavelength bands, depending on the design of light-emitting layers thereof.

Each light-emitting element 420 may be an organic light-emitting diode OLED. The OLED 420 may include a first electrode layer, an electron activation layer, a light-emitting layer, a hole activation layer, and a second electrode layer. The first and second electrode layers may be cathode and anode electrodes, respectively.

The OLED 420 may be formed by successively laminating a first electrode layer, an electron activation layer, a light-emitting layer, a hole activation layer, and a second electrode layer on the core fiber 410. The first electrode layer, the electron activation layer, the light-emitting layer, the hole activation layer, and the second electrode layer may be formed on the entire outer peripheral surface of the core fiber 410 or on at least a part of the outer peripheral surface.

The multiple driving elements 430 may be disposed in a row along the longitudinal direction of the core fiber 410. The multiple driving elements 430 may be disposed on the core fiber 410 such that a driving element is spaced apart from an adjacent driving element by a predetermined interval.

Each driving element 430 may be a thin-film transistor (TFT). The TFT 430 may include a source layer (or source electrode) 431, a drain layer (or drain electrode) 432, an active layer (not illustrate), a gate insulator 434, and a gate layer (or gate electrode) 435.

The source layer 431 may be formed on the outer peripheral surface of the core fiber 410 in an L-shape. Specifically, the source layer 431 may include a first portion (horizontal portion) extending in the longitudinal direction of the core fiber 410, and a second portion (vertical portion) extending from an end of the first portion in the circumferential direction of the core fiber 410.

The source layer 431 is configured to supply carriers to the active layer. Carriers begin to flow from the source layer 431 inside the TFT 430.

The drain layer 432 may be formed in a straight shape on the outer peripheral surface of the core fiber 410. The drain layer 432 may be formed to extend in the longitudinal direction of the core fiber 410. The drain layer 432 may be electrically connected to the first electrode layer of the OLED 420. The drain layer 432 is configured to receive carriers from the active layer.

The active layer is disposed between the source layer 431 and the drain layer 432 such that carriers pass from the source layer 431 to the drain layer 432. That is, the flow of carriers in the TFT 430 is in the order of: the source layer 431, the active layer, and the drain layer 432.

The gate insulator 434 may be formed on the core fiber 410 and the active layer. The gate insulator 434 is disposed between the active layer and the gate layer 435 so as to electrically insulate between the active layer and the gate layer 435.

The gate layer 435 may be formed on the gate insulator 434. The gate layer 435 may be formed to extend in the circumferential direction of the core fiber 410 from a point corresponding to the position of the active layer. The gate layer 435 is configured to adjust a flow of current from the source layer 431 toward the drain layer 432 or to block the flow.

The first contact pad 440 may be disposed in an area adjacent to the OLED 420 and electrically connected to an anode electrode 425 positioned at the uppermost end of the OLED 420. The first contact pad 440 may be formed to extend on the core fiber 410 in the longitudinal direction and in the circumferential direction. The first contact pad 440 may have a thickness and a width identical to or different from those of the anode electrode 425.

The first contact pad 440 may be configured to electrically connect the anode electrode 425 of the OLED 420 and the wire fiber 500 and to spatially separate the anode electrode 425 and the wire fiber 500.

The second contact pad 450 may be disposed in an area adjacent to the TFT 430 and electrically connect the source layer 431 of the TFT 430. The second contact pad 450 may be formed on the core fiber 410 so as to extend in the longitudinal direction and in the circumferential direction. The second contact pad 450 may be formed to contact a side surface of the source layer 431. The second contact pad 450 may have a thickness and a width identical to or different from those of the source layer 431.

The second contact pad 450 may be configured to electrically connect the source layer 431 of the TFT 430 and the wire fiber 500 and to spatially separate the source layer 431 and the wire fiber 500.

The third contact pad 460 may be disposed in an area adjacent to the TFT 430 and electrically connect the gate electrode 432 of the TFT 430. The third contact pad 460 may be formed on the core fiber 410 so as to extend in the longitudinal direction and in the circumferential direction. The third contact pad 460 may be formed to contact a side surface of the gate electrode 432. The third contact pad 460 may have a thickness and a width identical to or different from those of the gate electrode 432.

The third contact pad 460 may be configured to electrically connect the gate electrode 432 of the TFT 430 and the wire fiber 500 and to spatially separate the gate electrode 432 and the wire fiber 500.

The first to third contact pads 440-460 may be formed in rectangular shapes, but are not necessarily limited thereto. In addition, the first to third contact pads 440-460 may be made of a conductive metal material such as copper (Cu), aluminum (Al), silver (Ag), or gold (Au).

As described above, the element fiber 400 according to the present disclosure has multiple contact pads 440-460 disposed in areas adjacent to the OLED 420 and the TFT 430, thereby having a connecting structure in which a wire fiber 500 has no direct contact with the OLED 420 and the TFT 430.

FIG. 6A to FIG. 6H illustrate a method for manufacturing an element fiber according to an embodiment of the present disclosure.

Referring to FIG. 6A to FIG. 6H, a core fiber 410 extending in a longitudinal direction may be provided.

A pre-patterned mask may be disposed on the core fiber 410, and the mask may be used to for a source layer 431 and a drain layer 432 on the core fiber 410. The source layer 431 and the drain layer 432 may be formed by using thermal vacuum evaporation or sputtering.

The source layer 431 may be formed on the core fiber 410 in an L-shape. The source layer 431 may include a horizontal portion extending in a straight shape on the core fiber 410. The source layer 431 may have a vertical portion formed to be elongated from the upper portion of the core fiber 410 to the lower portion thereof. When the source layer 431 is laminated by using thermal vacuum evaporation, the source layer 431 has a thinner film deposited on the lower portion of the core fiber 410 than that on the upper portion thereof, due to the radius of curvature of the core fiber 410.

The drain layer 432 may be formed on the core fiber 410 in a straight shape. The drain layer 432 may be spaced apart from the horizontal portion of the source layer 431 by a predetermined distance.

The source layer 431 and the drain layer 432 may be made of a conductive material such as copper (Cu), aluminum (Al), silver (Ag), gold (Au), nickel (Ni), or indium tin oxide (ITO).

After the source layer 431 and the drain layer 432 are completely laminated, a pre-patterned mask may be disposed between the source layer 431 and the drain layer 432, and the mask may be used to form an active layer 433 on the core fiber 410. The active layer 433 may be formed by using thermal vacuum evaporation or sputtering. The active layer 433 may be made of an oxide material such as indium gallium zinc oxide (IGZO) or indium tin zinc oxide (ITZO).

After the active layer 433 is completely laminated, a gate insulator 434 may be formed on the core fiber 410 and the active layer 433. The gate insulator 434 may be formed by using chemical vapor deposition (CVD), dip-coating, or thermal vacuum evaporation. The gate insulator 434 may be formed to surround the outer peripheral surface of the core fiber 410. The gate insulator 434 may be made of an insulating oxide such as Al2O3 or Zn.

After the gate insulator 434 is completely laminated, a pre-patterned mask may be disposed on the gate insulator 434, and the mask may be used to form a gate layer 435 on the core fiber 410. The gate layer 435 may be formed by using thermal vacuum evaporation or sputtering.

The gate layer 435 may be formed to extend in the circumferential direction of the core fiber 410 from a point corresponding to the position of the active layer 433. When the gate layer 435 is laminated by using thermal vacuum evaporation, the gate layer 435 has a thinner film deposited on the lower portion of the core fiber 410 than that on the upper portion thereof, due to the radius of curvature of the core fiber 410. The gate layer 435 may be made of a conductive material such as copper (Cu), aluminum (Al), silver (Ag), gold (Au), nickel (Ni), or indium tin oxide (ITO).

As such, the source layer 431, the drain layer 432, the active layer 433, the gate insulator 434, and the gate layer 435 may be successively laminated on the core fiber 410, thereby constituting a TFT 430.

Meanwhile, it will be obvious to a person skilled in the art that, although it is assumed in the description of the present embodiment that the active layer is formed after the source/drain layers are generated, the same is not necessarily limited thereto, and the source/drain layers may be generated after the active layer is generated. Moreover, it will be obvious to a person skilled in the art that, although a method for manufacturing a top gate-type TFT is described as an example in the present embodiment, the same is not necessarily limited thereto, and a bottom gate-type TFT may also be manufactured.

After the TFT 430 is completely manufactured, a first electrode layer, an electron activation layer, a light-emitting layer, and a hole activation layer may be successively laminated in an area adjacent to the TFT 430.

The first electrode layer, the electron activation layer, the light-emitting layer, and the hole activation layer may be laminated by using dip-coating. In this case, the first electrode layer, the electron activation layer, the light-emitting layer, and the hole activation layer may be formed to surround the entire outer peripheral surface of the core fiber 410. The first electrode layer (that is, cathode electrode) may be formed to contact the drain layer 432 of the TFT 430.

Figure 7:
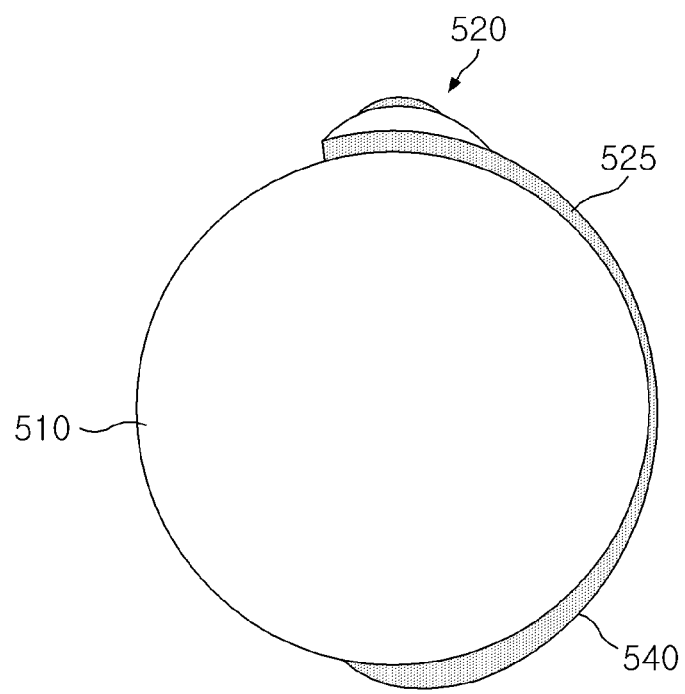
FIG. 7 is a sectional view of an element fiber according to another embodiment of the present disclosure.

Meanwhile, as illustrated in FIG. 7, the first electrode layer, the electron activation layer, the light-emitting layer, and the hole activation layer of the OLED 520 layer may be laminated by using thermal vacuum evaporation. In this case, the first electrode layer, the electron activation layer, the light-emitting layer, and the hole activation layer may be formed on a part of the core fiber 510. The first electrode layer (that is, cathode electrode) 525 may be formed to be connected to the first contact pad 540.

After organic and inorganic layers are completely laminated, a pre-patterned mask may be disposed on the core fiber 410, and the mask may be used to form a second electrode layer (that is, anode electrode) 425, a first contact pad 440, a second contact pad 450, and a third contact pad 460. The anode electrode 425 and the contact pads 440-460 may be simultaneously formed by using thermal vacuum evaporation or sputtering.

When the second contact pad 450 and the third contact pad 460 are implemented, thin films having sufficient thicknesses are necessary for stable electric connection between the contact pads 450 and 460 and the source and gate layers 431 and 435. Therefore, in order to compensate for the small thicknesses of the source layer 431 and the gate layer 435 applied under the core fiber 410, a process of rotating the core fiber 410 by a predetermined angle (that is, a partially rotating process) is necessary before initiating the corresponding laminating process. After rotating the core fiber 410 by a predetermined angle, an anode layer 425, a first contact pad 440, a second contact pad 450, and a third contact pad 460 may be deposited on the lower end of the core fiber 410. Such thickness compensation may guarantee stable electric connection between the elements of the TFT 430 and the contact pads 450 and 460.

Figure 8A:
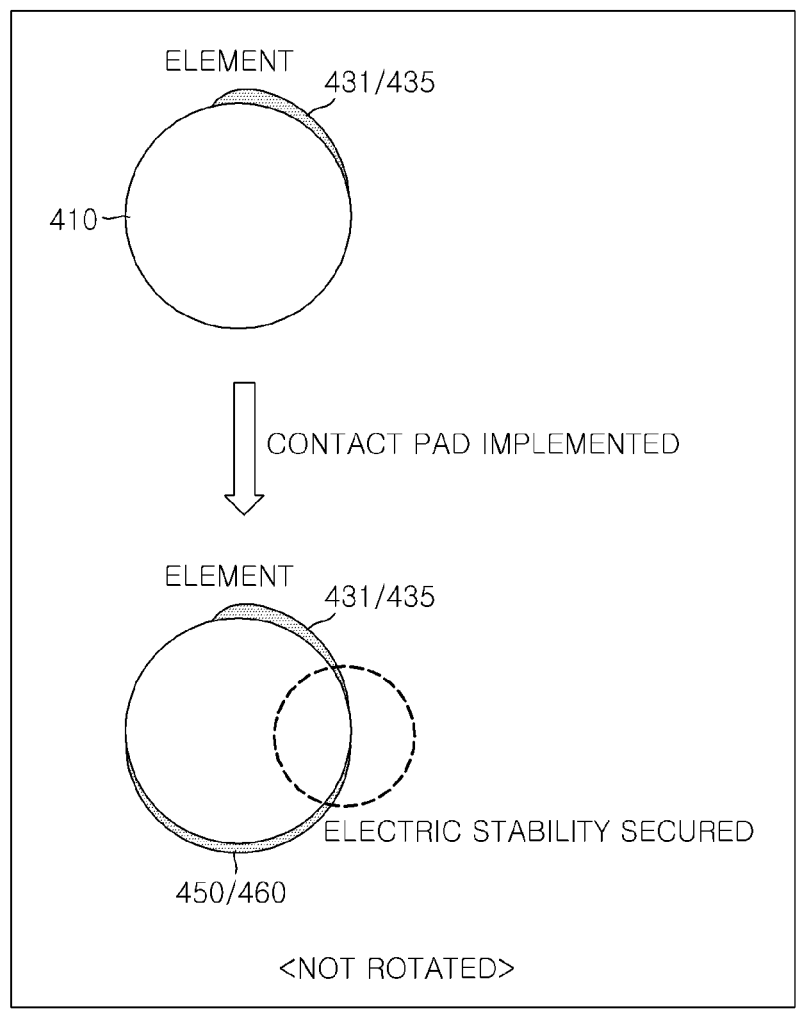
FIG. 8A and FIG. 8B illustrate methods for implementing a contact pad according to whether an element fiber is rotated or not.
Figure 8B:
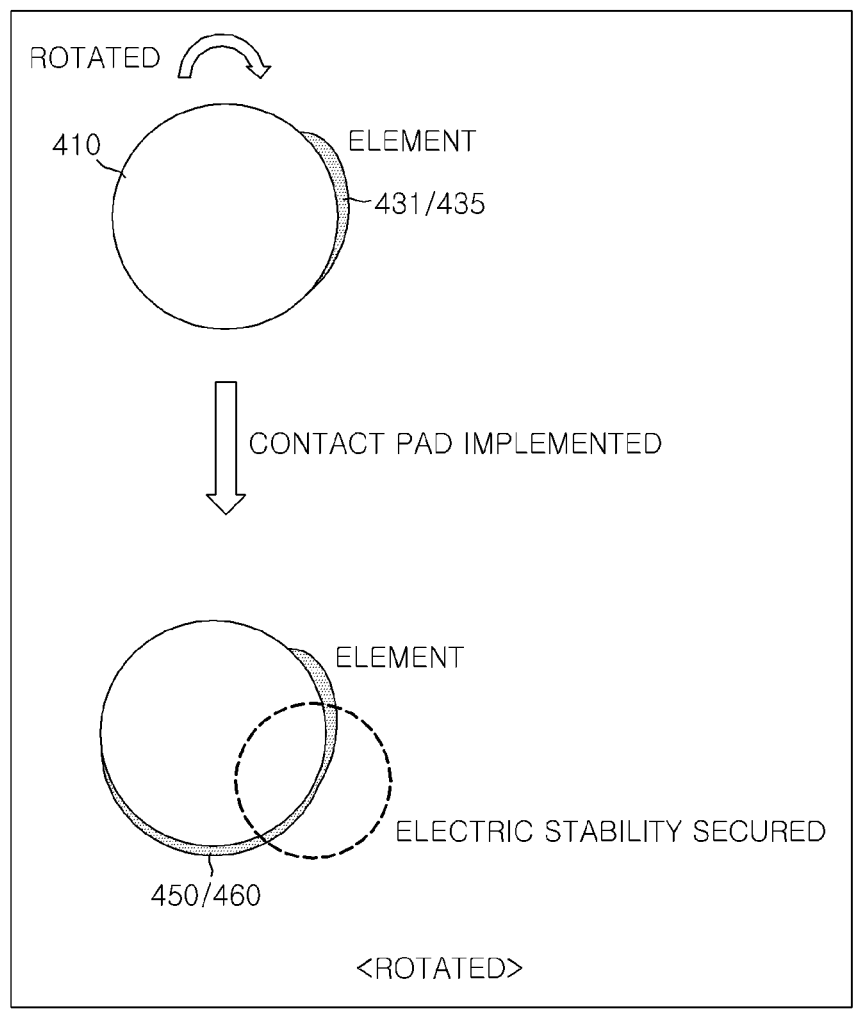

For example, as illustrated in FIG. 8A, when a contact pad is implemented without rotating the core fiber 410, an insufficient thin film is deposited on the end portion of the source layer or the gate layer, thereby causing electric instability between the source layer or the gate layer and the contact pad. On the other hand, as illustrated in FIG. 8B, when a contact pad is implemented after rotating the core fiber 410 by a predetermined angle, the thickness of the thin film formed on the end portion of the source layer or the gate layer is compensated for, thereby securing electric stability between the source layer or the gate layer and the contact pad.

Meanwhile, although not illustrated in the drawings, the partially rotating process may be replaced with a process of forming the anode electrode and the contact pads concurrently with rotating the core fiber 410 by 360°.

The anode electrode 425 may be formed on the entire upper surface of the hole activation layer or on at least a part of the upper surface of the hole activation layer.

The first contact pad 440 may be formed to be electrically connected to a side surface of an anode electrode 425 positioned at the uppermost end of the OLED 420. The first contact pad 440 may be formed to extend on the core fiber 410 in the longitudinal direction and in the circumferential direction.

The second contact pad 450 may be formed to be electrically connected to a side surface of a source layer 431 constituting the TFT 430. The second contact pad 450 may be formed to extend on the core fiber 410 in the longitudinal direction and in the circumferential direction.

The third contact pad 460 may be formed to be electrically connected to a side surface of a gate layer 435 constituting the TFT 430. The third contact pad 460 may be formed to extend on the core fiber 410 in the longitudinal direction and in the circumferential direction.

The anode electrode 425, the first contact pad 440, the second contact pad 450, and the third contact pad 460 may be made of a conductive material such as copper (Cu), aluminum (Al), silver (Ag), gold (Au), nickel (Ni), or indium tin oxide (ITO).

Meanwhile, it will be obvious to a person skilled in the art that, although it is assumed in the description of the present embodiment that the drain layer of the TFT and the cathode electrode of the OLED are connected, the same is not necessarily limited thereto, and it is possible to connect the drain layer/the anode electrode, the source layer/the cathode electrode, and the source layer/anode electrode, depending on the structure of the TFT and the OLED.

Advantageous effects of a fiber-type organic light-emitting display panel and a method for manufacturing the same, according to embodiments of the present disclosure, will now be described.

At least one of embodiments of the present disclosure is advantageous in that multiple contact pads are disposed on an element fiber in view of the position in which an OLED and a TFT are mounted, thereby having a connecting structure in which a wire fiber has no direct contact with the OLED and the TFT of the element fiber.

In addition, at least one of embodiments of the present disclosure is advantageous in that multiple contact pads are disposed on an element fiber in view of the position in which an OLED and a TFT are mounted, thereby effectively implementing weaving integration of the fiber-type organic light-emitting display panel without destroying the OLED and the TFT, while guaranteeing stable electric contact between the element fiber and the wire fiber.

However, advantageous effects obtainable from the fiber-type organic light-emitting display panel and the method for manufacturing the same, according to embodiments of the present disclosure, are not limited to the above-mentioned advantageous effects, and other advantageous effects not mentioned herein will be clearly understood from the following description by a person skilled in the art.

Meanwhile, although specific embodiments of the present disclosure have been described above, it is obvious that various modifications are possible without deviating from the scope of the present disclosure. Therefore, the scope of the present disclosure is not limited to the described embodiments, and is to be defined by not only the appended claims, but also equivalents thereof.

What is claimed is:

1. A fiber-type organic light-emitting display panel comprising:
    a plurality of element fibers extending in a first direction; and
    a plurality of wire fibers extending in a second direction, the plurality of wire fibers being woven with the plurality of element fibers,
    wherein each element fiber comprises
    a core fiber,
    a light-emitting element and a driving element mounted on the core fiber,
    a first contact pad disposed in an area adjacent to the light-emitting element so as to electrically connect a first electrode layer of the light-emitting element and a first wire fiber,
    a second contact pad disposed in an area adjacent to the driving element so as to electrically connect a first electrode of the driving element and a second wire fiber, and
    a third contact pad disposed in an area adjacent to the driving element so as to electrically connect a second electrode of the driving element and a third wire fiber.

2. The fiber-type organic light-emitting display panel of claim 1, wherein the light-emitting element is an organic light-emitting diode, and the driving element is a thin-film transistor (TFT).

3. The fiber-type organic light-emitting display panel of claim 2, wherein the first electrode layer of the light-emitting element is an anode electrode, the first electrode of the driving element is a source electrode, and the second electrode of the driving element is a gate electrode.

4. The fiber-type organic light-emitting display panel of claim 3, wherein the first contact pad makes contact with a side surface of an anode electrode positioned at an uppermost end of the organic light-emitting diode.

5. The fiber-type organic light-emitting display panel of claim 4, wherein the first contact pad electrically connects the anode electrode of the organic light-emitting diode and the first wire fiber and spatially separates the anode electrode and the first wire fiber.

6. The fiber-type organic light-emitting display panel of claim 3, wherein the second contact pad makes contact with a side surface of a source electrode constituting the thin-film transistor.

7. The fiber-type organic light-emitting display panel of claim 6, wherein the second contact pad electrically connects the source electrode of the thin-film transistor and the second wire fiber and spatially separates the source electrode and the second wire fiber.

8. The fiber-type organic light-emitting display panel of claim 3, wherein the third contact pad makes contact with a side surface of a gate electrode constituting the thin-film transistor.

9. The fiber-type organic light-emitting display panel of claim 8, wherein the third contact pad electrically connects the gate electrode of the thin-film transistor and the third wire fiber and spatially separates the gate electrode and the third wire fiber.

10. The fiber-type organic light-emitting display panel of claim 1, wherein the first to third contact pads are formed by using thermal vacuum evaporation or sputtering.

11. The fiber-type organic light-emitting display panel of claim 10, wherein a process of laminating the first to third contact pads proceeds in a state in which a core fiber having the light-emitting element and the driving element mounted thereon is rotated by a predetermined angle.

12. An element fiber for a display panel comprising:
a core fiber;
a light-emitting element mounted on the core fiber;
a driving element mounted on the core fiber;
a first contact pad disposed in an area adjacent to the light-emitting element so as to electrically connect a first electrode layer of the light-emitting element and a first wire fiber;
a second contact pad disposed in an area adjacent to the driving element so as to electrically connect a first electrode of the driving element and a second wire fiber; and
a third contact pad disposed in an area adjacent to the driving element so as to electrically connect a second electrode of the driving element and a third wire fiber.

\* \* \* \* \*